United States Patent
Fukushima et al.

(10) Patent No.: US 11,964,383 B2
(45) Date of Patent: Apr. 23, 2024

(54) ROBOT HAND AND ROBOT HAVING THE SAME

(71) Applicant: KAWASAKI JUKOGYO KABUSHIKI KAISHA, Kobe (JP)

(72) Inventors: Takayuki Fukushima, Takarazuka (JP); Shogo Matsuoka, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 589 days.

(21) Appl. No.: 17/288,409

(22) PCT Filed: Jan. 9, 2020

(86) PCT No.: PCT/JP2020/000476
§ 371 (c)(1),
(2) Date: Apr. 23, 2021

(87) PCT Pub. No.: WO2020/149210
PCT Pub. Date: Jul. 23, 2020

(65) Prior Publication Data
US 2021/0379769 A1 Dec. 9, 2021

(30) Foreign Application Priority Data

Jan. 16, 2019 (JP) ................. 2019-005534

(51) Int. Cl.
*B25J 15/00* (2006.01)
*B25J 11/00* (2006.01)

(52) U.S. Cl.
CPC ........ *B25J 15/0014* (2013.01); *B25J 11/0095* (2013.01)

(58) Field of Classification Search
CPC ............... B25J 15/0014; B25J 15/0641; B25J 11/0095; H01L 21/6838; H01L 21/67259; H01L 21/677; H01L 21/68707
USPC .................................................. 294/64.3, 213
See application file for complete search history.

(56) References Cited

U.S. PATENT DOCUMENTS

| 6,216,883 B1* | 4/2001 | Kobayashi | ........ H01L 21/68707 414/941 |
| 6,435,807 B1* | 8/2002 | Todorov | ............ H01L 21/68707 414/941 |
| 6,769,861 B2* | 8/2004 | Caveney | ............. H01L 21/6835 294/103.1 |

(Continued)

FOREIGN PATENT DOCUMENTS

JP 2002-264065 A 9/2002

*Primary Examiner* — Paul T Chin
(74) *Attorney, Agent, or Firm* — Oliff PLC (57) ABSTRACT

A robot hand includes base body defining gripping position of substrate, first contacting part provided to base body at tip-end side and configured to contact first part of edge part of substrate when substrate is gripped, rotary body provided on base-end side of base body and having second contacting part configured to contact second part of edge part of substrate when substrate is gripped, and mobile body having shaft part to be inserted into shaft hole of rotary body, and configured to move toward tip end of base body to move rotary body toward tip end of the base body. An axial-center line of shaft part extends in thickness directions of base and rotary bodies provided so as to have clearance in axial direction of shaft part with respect to shaft part.

3 Claims, 10 Drawing Sheets (56) References Cited

U.S. PATENT DOCUMENTS

| | | | | |
|---|---|---|---|---|
| 7,669,903 B2* | 3/2010 | Bonora | ............... | H01L 21/6838 |
| | | | | 294/902 |
| 8,454,068 B2* | 6/2013 | Hashimoto | ....... | H01L 21/67748 |
| | | | | 294/213 |
| 8,764,085 B2* | 7/2014 | Urabe | ................. | B25J 15/0014 |
| | | | | 294/103.1 |
| 8,801,069 B2* | 8/2014 | Hosek | ............... | H01L 21/67742 |
| | | | | 294/213 |
| 10,283,395 B2* | 5/2019 | Fukushima | ....... | H01L 21/67766 |
| 11,837,485 B2* | 12/2023 | Yoshida | ............... | B25J 11/0095 |
| 2007/0216179 A1* | 9/2007 | Hirooka | ............ | H01L 21/68707 |
| | | | | 294/103.1 |
| 2016/0243707 A1* | 8/2016 | Matsuhira | ............ | B25J 11/0095 |

\* cited by examiner

ROBOT HAND AND ROBOT HAVING THE SAME

TECHNICAL FIELD

The present disclosure relates to a robot hand and a robot having the same.

BACKGROUND ART

Conventionally, a robot hand which grips a substrate is known. Patent Document 1 discloses a wafer transferring robot as one example of such a robot hand.

Patent Document 1 discloses to advance a mover of an ultrasonic motor toward a tip end of a hand, and push a wafer by a mobile claw toward a fixed claw which is fixed to the robot hand on its tip-end side, so as to grip an edge part of the wafer by the mobile claw and the fixed claw.

REFERENCE DOCUMENT OF CONVENTIONAL ART

Patent Document

[Patent Document 1] JP2002-264065A

DESCRIPTION OF THE DISCLOSURE

Problem to be Solved by the Disclosure

Meanwhile, when the robot hand disclosed in Patent Document 1 and other conventional robot hands grip the substrate, they may not be able to grip the substrate due to a reception of a reaction force from the substrate.

Therefore, one purpose of the present disclosure is to provide a robot hand and a robot having the robot hand, capable of certainly gripping a substrate.

SUMMARY OF THE DISCLOSURE

In order to solve the problem, a robot hand according to one embodiment of the present disclosure includes a base body defining a gripping position of a substrate, a first contacting part provided to the base body at a tip-end side and configured to contact a first part of an edge part of the substrate when the substrate is gripped, a rotary body provided on a base-end side of the base body and having a second contacting part configured to contact a second part of the edge part of the substrate when the substrate is gripped, and a mobile body having a shaft part to be inserted into a shaft hole of the rotary body, and configured to move toward the tip end of the base body to move the rotary body toward the tip end of the base body. An axial-center line of the shaft part extends in a thickness direction of the base body, and the rotary body is provided so as to have a clearance in an axial direction of the shaft part with respect to the shaft part. The robot hand further includes a motion regulating part configured to regulate a motion of the rotary body in the axial direction by contacting an edge part of the rotary body in a state where the mobile body and the rotary body are moved toward the base end of the base body more than when the substrate is being gripped.

According to this configuration, the motion of the rotary body in the axial direction of the shaft part of the mobile body is regulated by the motion regulating part while the mobile body and the rotary body are moved toward the base end of the base body more than when the substrate is being gripped. Therefore, the robot hand according to this embodiment of the present disclosure can certainly grip the substrate.

Effect of the Disclosure

According to the present disclosure, a robot hand and a robot having the robot hand, capable of certainly gripping a substrate can be provided.

BRIEF DESCRIPTION OF DRAWINGS

FIGS. 5(A) and 5(B) are partially enlarged cross-sectional views of the robot hand according to this embodiment of the present disclosure, where

FIG. 6(A) illustrates an initial state, and FIG. 6(B) illustrates a state where the semiconductor wafer is gripped.

FIG. 7(A) illustrates a state immediately before the semiconductor wafer is lifted, and FIG. 7(B) illustrates a state where the semiconductor wafer is lifted and gripped.

FIGS. 9(A) and 9(B) are schematic views illustrating a situation where the rotary body of the robot hand according to this embodiment of the present disclosure moves from the base-end side toward the tip-end side, where FIG. 9(A) is a cross-sectional view taken along a line IXA-IXA in FIG. 7(A), and FIG. 9(B) is a cross-sectional view taken along a line IXB-IXB in FIG. 7(B).

FIGS. 11(A) and 11(B) are schematic views illustrating a situation where the rotary body of the modification of the robot hand according to this embodiment of the present disclosure moves from the base-end side to the tip-end side, where

MODE FOR CARRYING OUT THE DISCLOSURE

Hereinafter, a robot hand, a robot and a robot system having the robot hand according to one embodiment of the present disclosure, are described with reference to the accompanying drawings. Note that this embodiment does not limit the present disclosure. Moreover, below, the same reference characters are given to the same or corresponding elements throughout the drawings to omit redundant description.

(Robot System 10)

Figure 1:
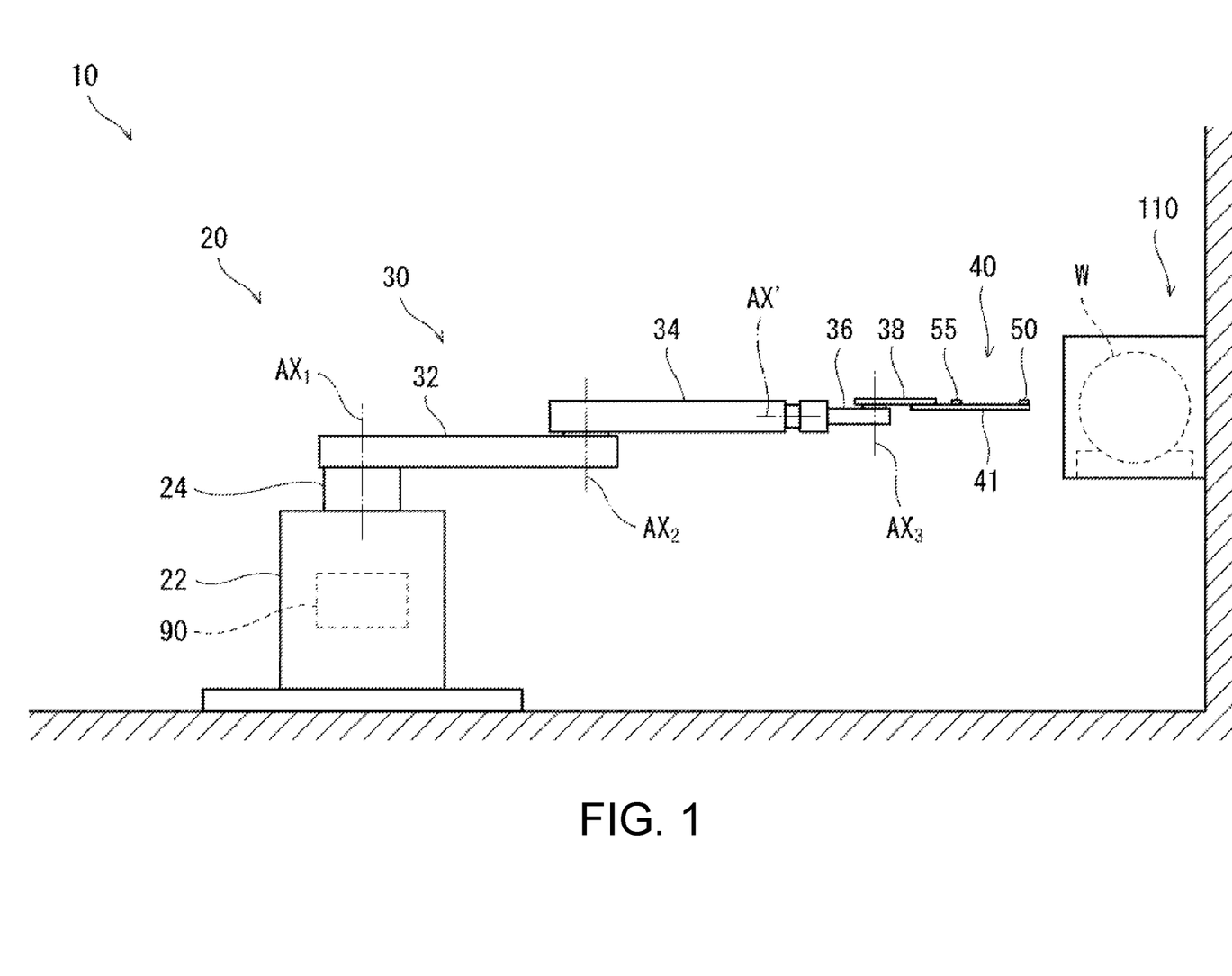
FIG. 1 is a schematic view illustrating the entire configuration of a robot system according to one embodiment of the present disclosure.

FIG. 1 is a schematic view illustrating the entire configuration of the robot system according to this embodiment. As illustrated in FIG. 1, a robot system 10 according to this embodiment is provided with a robot 20 which transfers a semiconductor wafer W (a substrate) in a disc-shape by gripping it, and an accommodating device 110 which accommodates the semiconductor wafer W while being placed vertically.

(Robot 20)

As illustrated in FIG. 1, the robot 20 according to this embodiment is a horizontally articulated 3-axis robot having a turnable wrist part 36, and is provided with three joint axes. The robot 20 includes a pedestal 22, and a lifting shaft 24 provided to an upper surface of the pedestal 22 and vertically expandable and contractible. The lifting shaft 24 is comprised of, for example, an air cylinder (not illustrated) so as to be expandable and contractible.

Moreover, the robot 20 is further provided with a robotic arm 30 attached to an upper-end part of the lifting shaft 24, a robot hand 40 attached to a tip-end part of the robotic arm 30, and a robot controlling device 90 which controls operation of the robotic arm 30 and the robot hand 40.

(Robotic Arm 30)

The robotic arm 30 has a first link 32 extending horizontally, a second link 34 coupled to a tip-end part of the first link 32 and extending horizontally, the wrist part 36 coupled to a tip-end part of the second link 34, and a hand-base part 38 coupled to a tip-end part of the wrist part 36.

The first link 32 is coupled at its base-end part to the upper-end part of the lifting shaft 24 via a joint axis which is driven by a servomotor (not illustrated). Therefore, the first link 32 is rotatable about a first axial line $AX_1$ vertically extending and passing through an axial center of the lifting shaft 24.

The second link 34 is coupled at its base-end part to the tip-end part of the first link 32 via a joint axis which is driven by a servomotor (not illustrated). Therefore, the second link 34 is rotatable about a second axial line $AX_2$ vertically extending and passing through the tip-end part of the first link 32.

The wrist part 36 is coupled at its base-end part to the tip-end part of the second link 34 via a turning axis which is driven by a servomotor (not illustrated). Therefore, the wrist part 36 is turnable about a turning axial line AX' horizontally extending and passing through an axial center of the second link 34.

The hand-base part 38 is coupled at its base-end part to the tip-end part of the wrist part 36 via a joint axis which is driven by a servomotor (not illustrated). Therefore, the hand-base part 38 is rotatable about a third axial line $AX_3$ vertically extending and passing through the tip-end part of the wrist part 36.

(Robot Hand 40)

Figure 2:
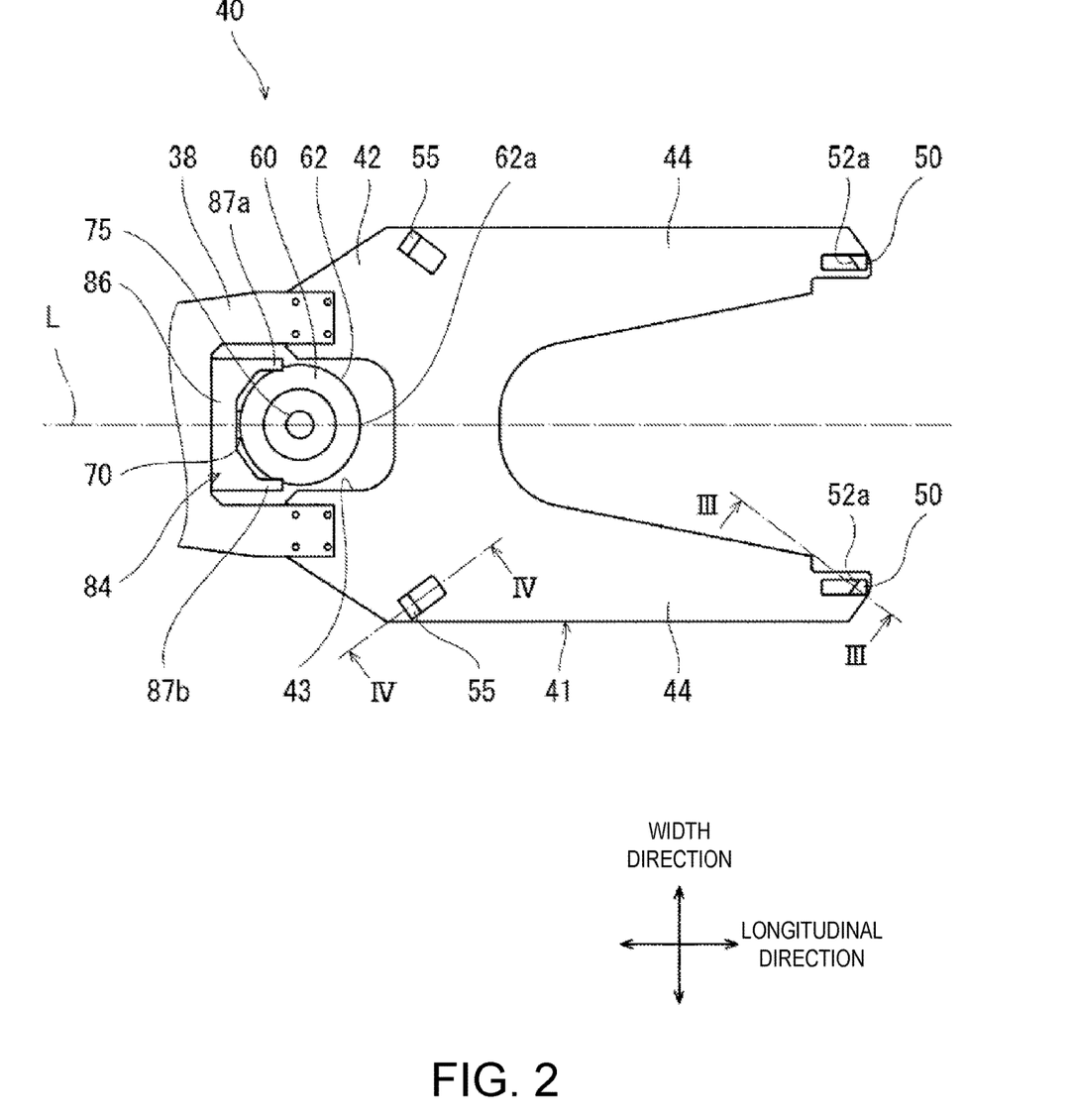
FIG. 2 is a schematic view of a robot hand according to this embodiment of the present disclosure when seen in a thickness direction.

FIG. 2 is a schematic view of the robot hand according to this embodiment, when seen in a thickness direction. As illustrated in FIG. 2, the robot hand 40 according to this embodiment is attached to a tip-end part of the hand-base part 38. The robot hand 40 has a base body 41 defining a longitudinal direction connecting its base end to its tip end, a width direction orthogonal to the longitudinal direction, and the thickness direction orthogonal to the longitudinal direction and the width direction. The base body 41 further defines a center line L extending in the longitudinal direction at the center in the width direction, and a gripping position at which the center of the semiconductor wafer W is located on the center line L (see FIG. 7(B)).

The base body 41 has a base part 42 provided to a base-end side thereof, and two base-branch parts 44 branched from the base part 42 so as to extend toward the tip end. The base part 42 and the two base-branch parts 44 are integrally formed. Moreover, a rectangular notch 43 when seen in the thickness direction is formed on a base-end side of the base part 42. By the base body 41 being structured as described above, it has a substantially Y-shape when seen in the thickness direction.

The robot hand 40 further includes engaging members 50 provided protrudingly from tip-end parts of principal surfaces of the two base-branch parts 44, respectively, so as to engage with first parts on an edge part of the semiconductor wafer W, and guiding members 55 provided protrudingly from both edge parts in the width direction of a principal surface of the base part 42, respectively.

Figure 3:
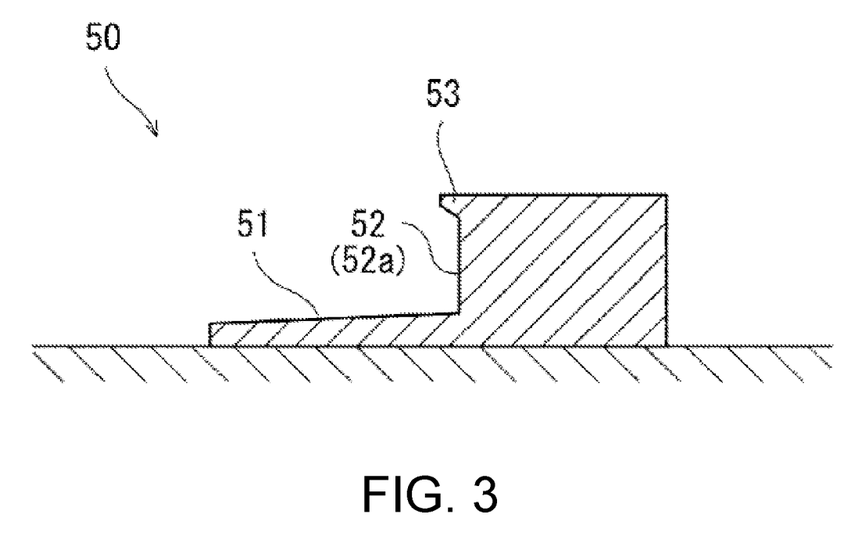
FIG. 3 is a cross-sectional view illustrating an engaging member of the robot hand according to this embodiment of the present disclosure, taken along a line III-III in FIG. 2.

FIG. 3 is a cross-sectional view illustrating the engaging member of the robot hand according to this embodiment, taken along a line III-III in FIG. 2. Each of the two engaging members 50 is fixedly provided to the principal surface of the corresponding base-branch part 44. Note that, as illustrated in FIG. 2, the shapes of the two engaging members 50 are line-symmetry with respect to the center line L. Therefore, here, only one engaging member 50 is described, and similar description of the other engaging member 50 is not repeated.

As illustrated in FIG. 3, the engaging member 50 has an inclining surface 51 inclining to separate from the principal surface of the base-branch part 44 toward the tip end of the principal surface of the base-branch part 44, a standing surface 52 bent from a tip end of the inclining surface 51 so as to stand in the thickness direction of the base body 41, and a flange 53 provided protrudingly from an upper end of the standing surface 52 toward the base end of the base body 41.

Figure 7:
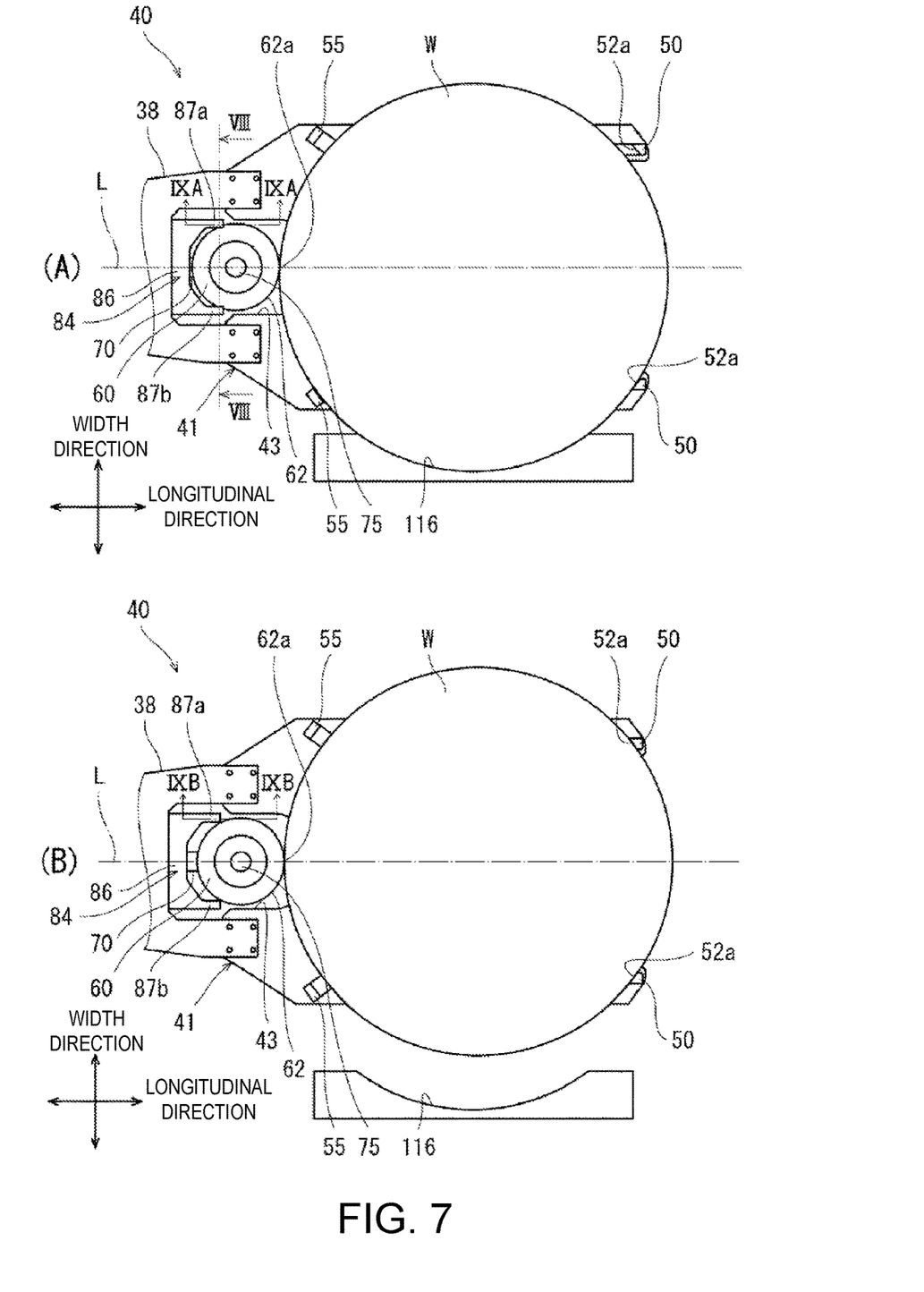
FIGS. 7(A) and 7(B) are schematic views, when seen in the thickness direction of the base body, illustrating a situation where the robot hand according to this embodiment of the present disclosure grips the semiconductor wafer vertically accommodated in the accommodating device, where

In this embodiment, when the semiconductor wafer W is gripped, the standing surface 52 constitutes a first contacting part 52a which contacts the first part of the edge part of the semiconductor wafer W (see FIG. 7(B)). The first contacting part 52a (and the standing surface 52) has an arc-shape when seen in the thickness direction of the base body 41, corresponding to the edge part of the semiconductor wafer W.

Figure 4:
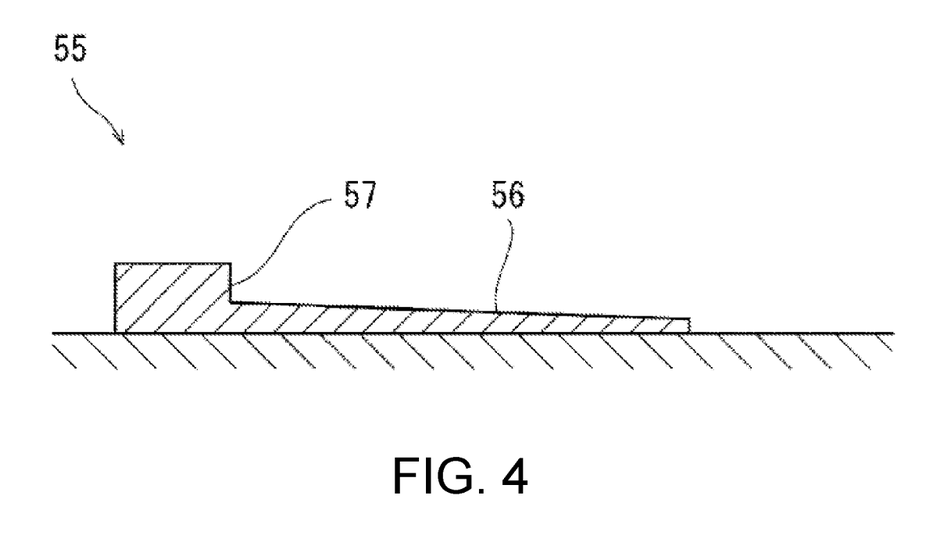
FIG. 4 is a cross-sectional view illustrating a guiding member of the robot hand according to this embodiment of the present disclosure, taken along a line IV-IV in FIG. 2.

FIG. 4 is a cross-sectional view illustrating the guiding member of the robot hand according to this embodiment, taken along a line Iv-Iv in FIG. 2. The two guiding members 55 are fixedly provided to the principal surface of the base part 42. Note that, as illustrated in FIG. 2, the shapes of the two guiding members 55 are line-symmetry with respect to the center line L. Therefore, here, only one guiding member 55 is described, and similar description of the other guiding member 55 is not repeated.

As illustrated in FIG. 4, the guiding member 55 has an inclining surface 56 inclining to approach the principal surface of the base part 42 toward the tip end of the principal surface of the base part 42, a standing surface 57 bent from a base end of the inclining surface 56 so as to stand in the thickness direction of the base body 41.

Figure 5:
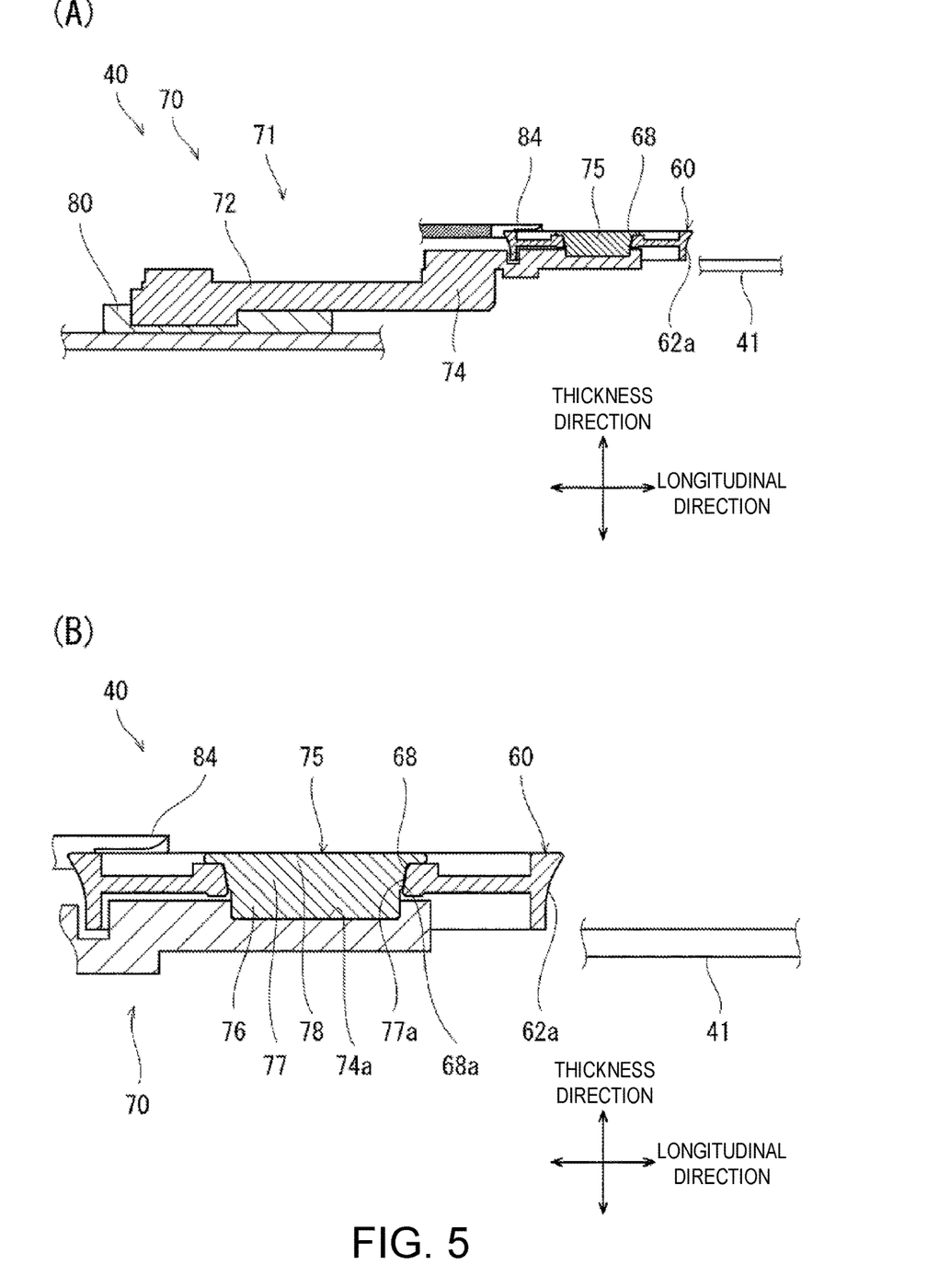
FIG. 5(A) is an enlarged cross-sectional view of a mobile body, a rotary body, and their peripheral part when taken in their thickness direction.
FIG. 5(B) is an enlarged cross-sectional view of a shaft part of the mobile body, the rotary body, and their peripheral part when taken in their thickness direction.

FIGS. 5(A) and 5(B) are partially enlarged cross-sectional views of the robot hand according to this embodiment of the present disclosure, where FIG. 5(A) is an enlarged cross-sectional view of a mobile body, a rotary body, and their peripheral part when taken in their thickness direction, and FIG. 5(B) is an enlarged cross-sectional view of a shaft part of the mobile body, the rotary body, and their peripheral part when taken in their thickness direction. As illustrated in FIG. 5(A), the robot hand 40 is further provided with a rotary body 60 provided near the principal surface of the base part 42, and a mobile body 70 reciprocatable along the center line L. The rotary body 60 and the mobile body 70 are each provided on the center line L.

The rotary body 60 has a circular edge part 62, and a shaft hole 68 is bored at the center of the rotary body 60 when seen in the thickness direction of the base body 41 (i.e., when seen as illustrated in FIG. 2). As illustrated in FIG. 5(B), the edge part 62 of the rotary body 60 extends in the thickness direction of the base body 41 from an end part on the base body 41 side, and then, it further extends in the thickness direction of the base body 41 while curving so as to separate from the shaft hole 68.

In the robot hand 40 according to this embodiment, since the edge part 62 of the rotary body 60 has the shape as described above, a second part of the gripped semiconductor wafer W is restricted to move in a direction separating from the base body 41 in the thickness direction. Moreover, since each of the two engaging members 50 has the flange 53, the two engaging members 50 engage with the first parts of the gripped semiconductor wafer W, respectively. According to this structure, the robot hand 40 can stably grip the semiconductor wafer W.

In this embodiment, when the semiconductor wafer W is gripped, a part of the edge part 62 of the rotary body 60 constitutes a second contacting part 62a which contacts the second part of the edge part of the semiconductor wafer W on the center line L.

Moreover, an inner wall of the shaft hole 68 of the rotary body 60 inclines at an acute angle with respect to the base body 41 when seen in the width direction of the base body 41. In this embodiment, a part of the inner wall of the shaft hole 68 constitutes a sliding surface 68a which will be described later. Accordingly, in this embodiment, the second contacting part 62a and the sliding surface 68a are both included in the rotary body 60. Moreover, the sliding surface 68a is provided on the base-end side of the second contacting part 62a on the center line L, and is integrally movable with the second contacting part 62a.

As illustrated in FIGS. 5(A) and 5(B), the mobile body 70 has a mobile member 71, and a shaft member 75 (a shaft part) fixed to a tip-end part of the mobile member 71. Here, as illustrated in FIG. 5(A), the robot hand 40 is further provided with a rail member 80 provided on the opposite side from the rotary body 60 and the shaft member 75 with respect to the base body 41 in the thickness direction of the base body 41, and an actuator (not illustrated) which drives the mobile member 71.

The rail member 80 extends along the center line L, and a base-end part of the mobile member 71 is slidably attached thereto. The actuator for driving the mobile member 71 may be configured to have, for example, an electric motor and a power transmission mechanism (e.g., a rack and pinion, or a ball screw), or comprised of a pneumatic cylinder, a hydraulic cylinder, etc. Operation of the actuator is controlled by the robot controlling device 90. The actuator may be supported by the hand-base part 38 to which the robot hand 40 is attached.

The mobile member 71 has a first part 72 attached at its base-end part to the rail member 80 and extending along the center line L, and a second part 74 extending along the center line L from an upper surface of a tip-end part of the first part 72. Then, a base-end part of the shaft member 75 is coupled to a concave part 74a formed in an upper surface of a tip-end part of the second part 74. The concave part 74a and the shaft member 75 are each provided to overlap with the notch 43 formed in the base part 42 when seen in the thickness direction of the base body 41 (i.e., when seen as illustrated in FIG. 2).

According to the above structure, the mobile member 71 (and the shaft member 75 and the rotary body 60) is reciprocatable along the center line L without obstruction by the base body 41 and the other members. Moreover, according to the above structure, an application point of the reaction force from the semiconductor wafer W to the second contacting part 62a differs from an application point of a thrust which moves the mobile body 70 toward the tip end on the center line L, in the thickness direction of the base body 41.

The shaft member 75 has a base-end part 76 coupled to the concave part 74a of the mobile member 71, a tapered part 77 provided to an upper end of the base-end part 76, and a flange 78 radially protruding from an upper end of the tapered part 77. The base-end part 76 and the tapered part 77 of the shaft member 75 have diameters corresponding to the shaft hole 68 of the rotary body 60. A diameter of the flange 78 of the shaft member 75 is larger than that of the shaft hole 68 of the rotary body 60.

By the base-end part 76 and the tapered part 77 of the shaft member 75 being inserted into the shaft hole 68 of the rotary body 60, a movable range of the rotary body 60 with respect to the shaft member 75 in a plane where the longitudinal direction and the width direction intersect with each other, is regulated. In other words, a movable range of the second contacting part 62a and the sliding surface 68a with respect to a slid surface 77a in the plane where the longitudinal direction and the width direction intersect with each other, is regulated.

Moreover, since an edge part of the shaft hole 68 of the rotary body 60 is sandwiched between an edge part of the concave part 74a of the mobile member 71 and the flange 78 of the shaft member 75, a movable range of the rotary body 60 with respect to the shaft member 75 in the thickness direction is limited. In other words, a movable range of the second contacting part 62a and the sliding surface 68a with respect to the slid surface 77a in the plane where a longitudinal direction and the thickness direction intersect with each other, is regulated.

As illustrated in FIG. 5(B), an axial-center line of the shaft member 75 extends in the thickness direction of the base body 41. Then, the rotary body 60 is provided so as to have a clearance in the axial direction of the shaft member 75 with respect to the shaft member 75.

In this embodiment, by the rotary body 60 being positioned as described above, the mobile member 71 and the shaft member 75 cooperatively constitute a motion regulating structure which regulates the movable range of the rotary body 60 with respect to the shaft member 75. In other words, by the rotary body 60 being positioned as described above, the mobile member 71 and the shaft member 75 cooperatively constitute the motion regulating structure which regulates the movable range of the second contacting part 62a and the sliding surface 68a with respect to the slid surface 77a.

A cross-sectional area of the base-end part 76 of the shaft member 75 is uniform in the thickness direction of the base body 41. On the other hand, the tapered part 77 has a smaller cross-sectional area toward the base body 41 (and the base-end part 76). Therefore, when seen in the width direction of the base body 41, an outer surface of the tapered part 77 inclines at an acute angle with respect to the base body 41, corresponding to the inner wall of the shaft hole 68 of the rotary body 60. In this embodiment, a part of the outer surface of the tapered part 77 constitutes the slid surface 77a which will be described later.

According to the structure described above, when the semiconductor wafer W is gripped, the mobile body 70 moves toward the tip end of the base body 41 on the center line L to push the sliding surface 68a of the rotary body 60 by the slid surface 77a of the shaft member 75 and move the rotary body 60 having the sliding surface 68a and the second contacting part 62a toward the tip end of the base body 41.

In detail, when the semiconductor wafer W is gripped, the mobile body 70 moves toward the tip end of the base body 41 on the center line L, and the second contacting part 62a of the rotary body 60 receives the reaction force from the semiconductor wafer W, and thus, the sliding surface 68a of the rotary body 60 slides on the slid surface 77a. Accordingly, the rotary body 60 moves toward the base body 41.

(Robot Controlling Device 90)

The robot controlling device 90 is provided inside the pedestal 22. Although a concrete configuration of the robot controlling device 90 is not particularly limited, it may be implemented by, for example, a known processor (e.g., a CPU) operating in accordance with a program stored in a storage part (e.g., a memory).

(Accommodating Device 110)

As illustrated in FIG. 1, the accommodating device 110 is provided fixedly on a wall surface at a worksite. Moreover, the accommodating device 110 has a structure to vertically accommodate the semiconductor wafers W so that the semiconductor wafers W extend in the vertical direction. Here, a structure of the accommodating device 110 is described with reference to FIGS. 6(A) and 6(B).

Figure 6:
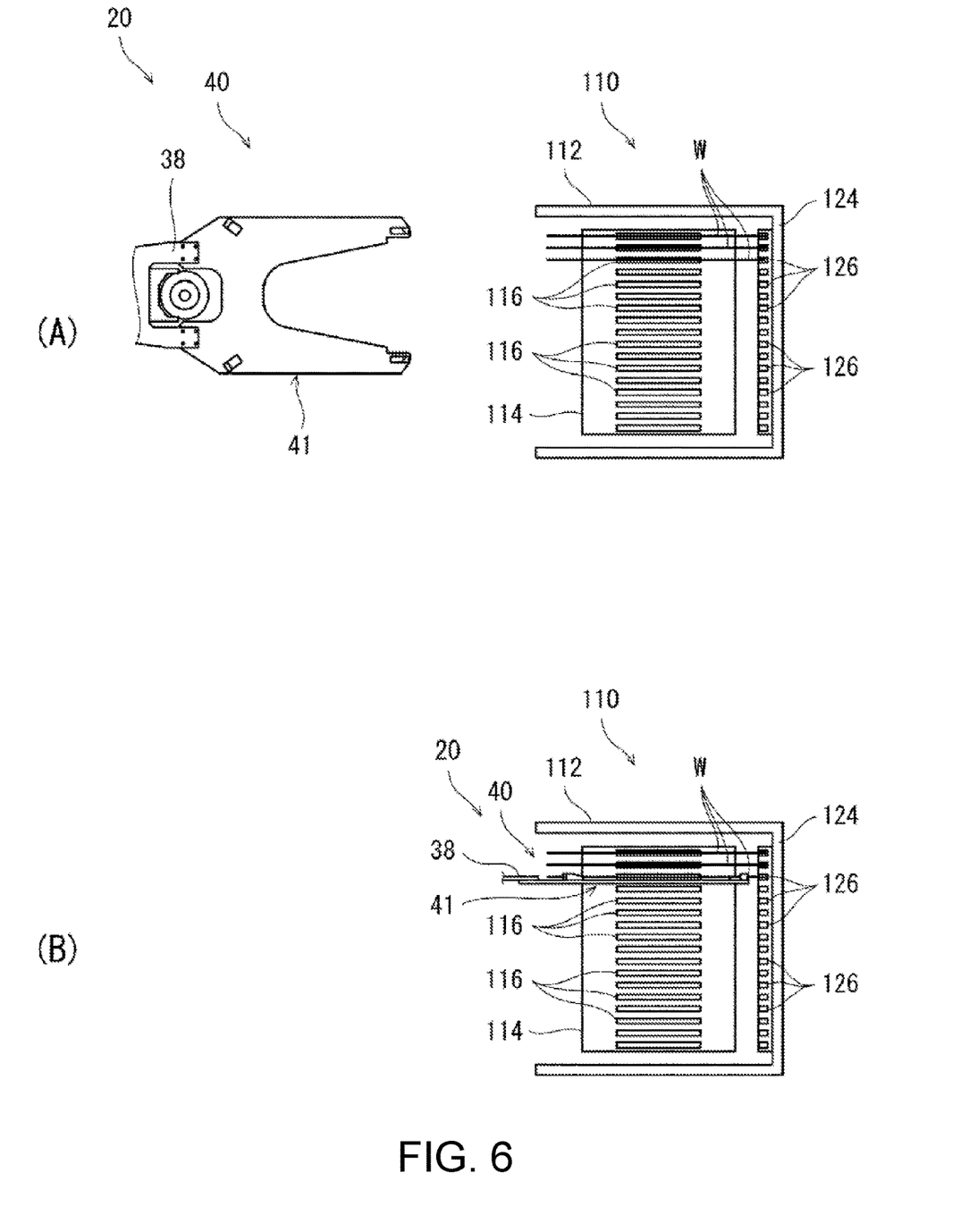
FIGS. 6(A) and 6(B) are schematic views, when seen from above, illustrating a situation where the robot hand according to this embodiment of the present disclosure grips the semiconductor wafer vertically accommodated in an accommodating device, where

FIGS. 6(A) and 6(B) are schematic views, when seen from above, illustrating a situation where the robot hand according to this embodiment grips the semiconductor wafer vertically accommodated in the accommodating device, where FIG. 6(A) illustrates an initial state, and FIG. 6(B) illustrates a state where the semiconductor wafer is gripped. As illustrated in FIG. 6(A), the accommodating device 110 is provided with a shell 112 in a box shape, of which a front surface facing to the robot 20 is opened, and an openable door (not illustrated) provided in front of the shell 112.

A plurality of bottom-plate grooves 116 are formed in an inner surface of a bottom plate 114 of the shell 112. The plurality of bottom-plate grooves 116 each extends in a direction connecting the front surface to a back surface of the shell, and are provided to align in a direction connecting a left surface to a right surface of the shell 112 having an equal interval therebetween (e.g., at 5 mm or above and 15 mm or below). An inner wall of each of the plurality of bottom-plate grooves 116 has, as illustrated in FIGS. 7(A) and 7(B) described later, an arc-shape corresponding to the edge part of the semiconductor wafer W, when seen in the direction connecting the left surface to the right surface of the shell 112.

A plurality of back-plate grooves 126 are formed in an inner surface of a back plate 124 of the shell 112. The plurality of back-plate grooves 126 each extends in a direction connecting the bottom surface to an upper surface of the shell 112, and are provided to align in a direction connecting the left surface to the right surface of the shell 112 having an equal interval therebetween (e.g., at 5 mm or above and 15 mm or below). The plurality of back-plate grooves 126 are formed at the same positions as the plurality of bottom-plate grooves 116, in the direction connecting the left surface to the right surface of the shell 112.

According to the structure described above, the accommodating device 110 can fit the edge part of the semiconductor wafer W into the bottom-plate groove 116 and the back-plate groove 126 of the shell 112, and thus, a plurality of semiconductor wafers W can be accommodated while being placed vertically.

Here, referring to FIGS. 6(A), 6(B), 7(A), and 7(B), one example of a process of taking the semiconductor wafer W vertically accommodated in the accommodating device 110, out of the accommodating device 110, is described.

FIGS. 7(A) and 7(B) are schematic views, when seen in the thickness direction of the base body, illustrating a situation where the robot hand according to this embodiment grips the semiconductor wafer vertically accommodated in the accommodating device, where FIG. 7(A) illustrates a state immediately before the semiconductor wafer is lifted, and FIG. 7(B) illustrates a state where the semiconductor wafer is lifted and gripped.

First, the wrist part 36 of the robotic arm 30 is turned from the initial state illustrated in FIG. 6(A) so as to bring the base body 41 of the robot hand 40 to extend vertically. Then, a posture of the robotic arm 30 is changed so that the robot hand 40 is at a position and in a posture grippable of the semiconductor wafer W vertically accommodated in the accommodating device 110, as illustrated in FIG. 6(B). Here, the position and the posture of the robot hand 40 grippable of the semiconductor wafer W vertically accommodated in the accommodating device 110, are a position and a posture where, as illustrated in FIG. 7(A), the standing surfaces 52 of the two engaging members 50, the standing surfaces 57 of the two guiding members 55, and the edge part 62 of the rotary body 60, are all facing to (or contact) the edge part of the semiconductor wafer W.

Then, by the mobile body 70 moving toward the tip end on the center line L, the second contacting part 62a of the rotary body 60 pushes the semiconductor wafer W toward the tip end. Thus, the semiconductor wafer W is pushed by the rotary body 60 from the base-end side of the base body 41 against the standing surfaces 52 of the two engaging members 50. In this manner, the robot hand 40 grips the vertically placed semiconductor wafer W.

Moreover, the robot hand 40 moves, while gripping the semiconductor wafer W, in a direction separating from a position at which the semiconductor wafer W is placed (from the bottom-plate groove 116 in FIG. 7(B)), so that the semiconductor wafer W separates from the bottom-plate groove 116 of the accommodating device 110. This state is illustrated in FIG. 7(B).

Finally, the posture of the robotic arm 30 is changed so as to move the robot hand 40 outside the accommodating device 110. Accordingly, the robot system 10 according to this embodiment can take the semiconductor wafer W vertically accommodated in the accommodating device 110, out of the accommodating device 110.

(Motion Regulating Part 84)

As illustrated in FIG. 2, the robot hand 40 is further provided with a motion regulating part 84 which regulates the motion of the rotary body 60 in the axial direction of the shaft member 75 by contacting with the edge part 62 of the rotary body 60, in a state where the mobile body 70 and the rotary body 60 are moved toward the base end of the base body 41 more than when the semiconductor wafer W is gripped.

The motion regulating part 84 is attached to a tip-end part of the hand-base part 38, and has a line-symmetry shape with respect to the center line L. The motion regulating part 84 has a motion-regulating base part 86 extending in the width direction of the base body 41, a motion-regulating branch part 87a extending toward the tip end from one end part of the motion-regulating base part 86 in its width direction, and a motion-regulating branch part 87b extending toward the tip end from the other end part of the motion-regulating base part 86 in its width direction.

Figure 8:
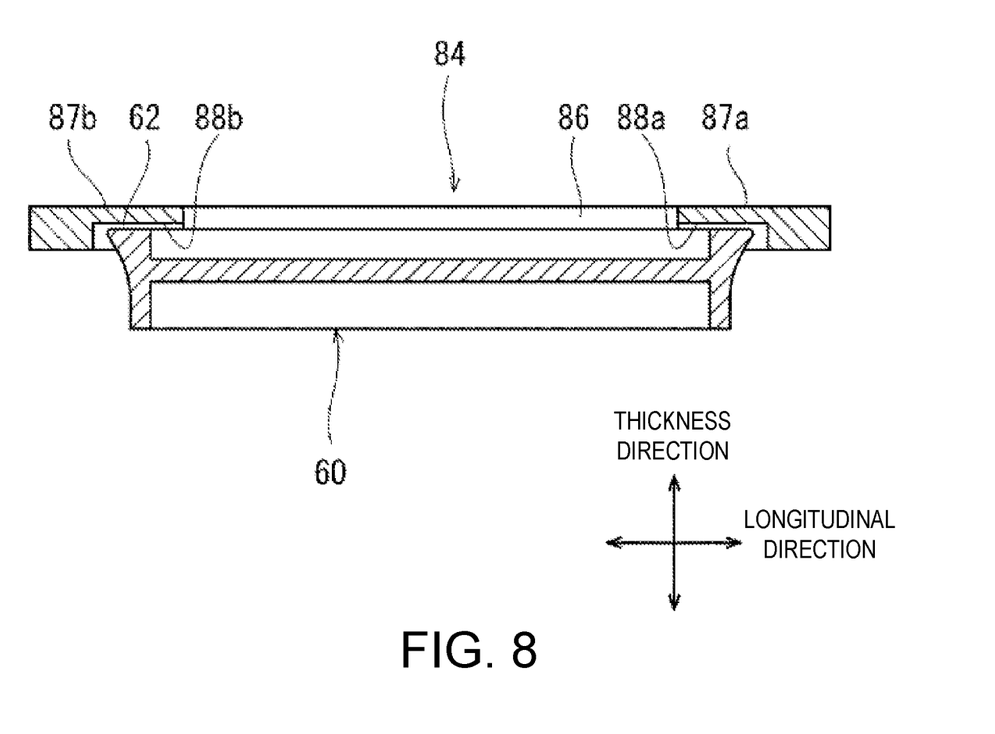
FIG. 8 is a cross-sectional view illustrating a state where a motion of the rotary body of the robot hand according to this embodiment of the present disclosure in an axial direction is regulated by a motion regulating part, taken along a line VIII-VIII in FIG. 7(A).
Figure 9:
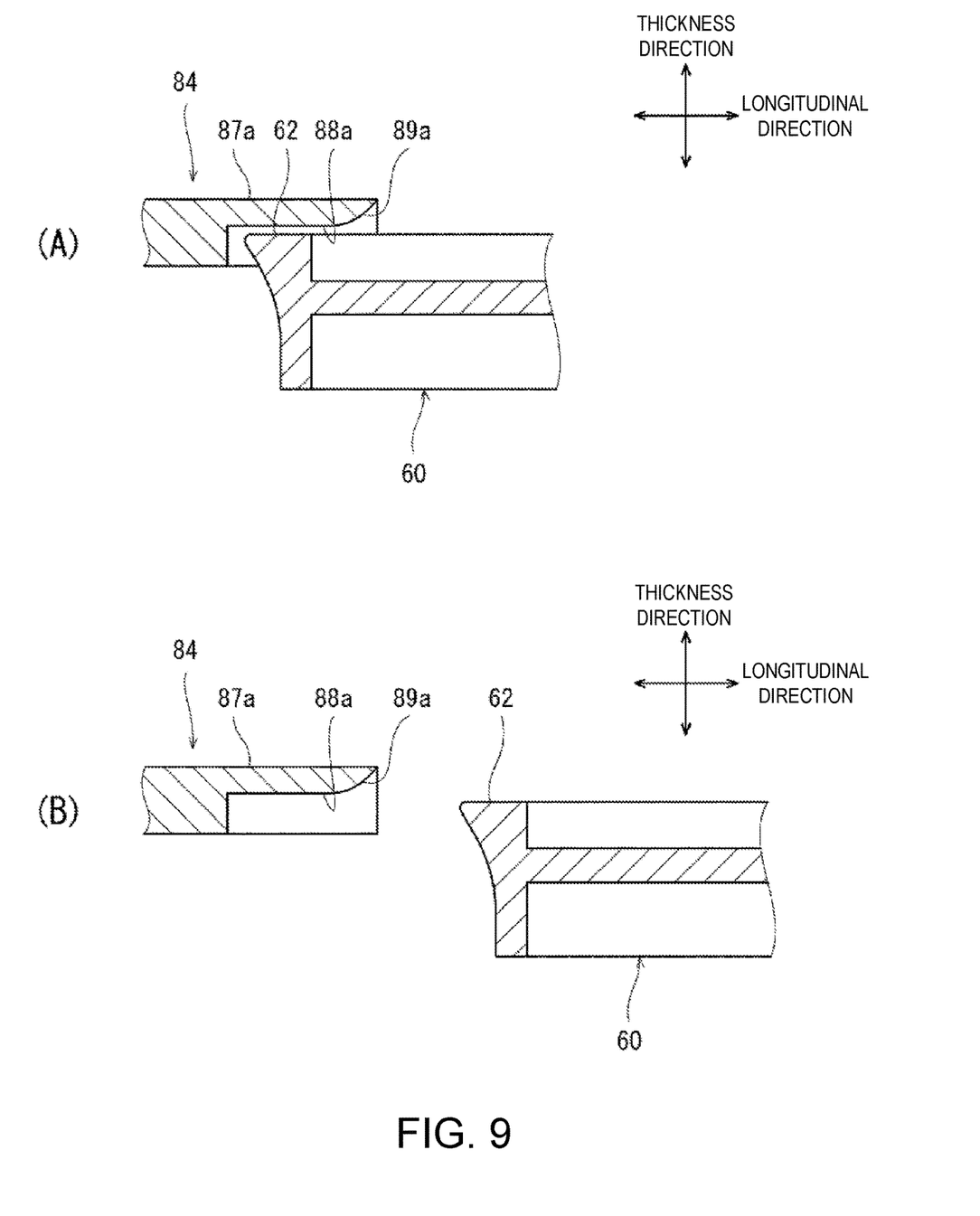

FIG. 8 is a cross-sectional view illustrating a state where the motion of the rotary body of the robot hand according to this embodiment in the axial direction is regulated by the motion regulating part, taken along a line VIII-VIII in FIG. 7(A). FIGS. 9(A) and 9(B) are schematic views illustrating a situation where the rotary body of the robot hand according to this embodiment moves from the base-end side toward the tip-end side, where FIG. 9(A) is a cross-sectional view taken along a line IXA-IXA in FIG. 7(A), and FIG. 9(B) is a cross-sectional view taken along a line IXB-IXB in FIG. 7(B).

As illustrated in FIGS. 8, 9(A), and 9(B), the motion-regulating branch part 87a is provided at its tip end with a concave part 88a, on the rotary body 60 side in the thickness direction. The concave part 88a has a rectangular-parallelepiped shape extending in the longitudinal direction, and its tip-end side and an inner side are opened. The concave part 88a is provided at its tip end with a guiding part 89a which internally guides the edge part 62 of the rotary body 60. Note that similar to the concave part 88a and the guiding part 89a of the motion-regulating branch part 87a, the motion-regulating branch part 87b is also provided with a concave part 88b and a guiding part 89b.

(Effects)

As illustrated in FIG. 7(A), upon gripping the semiconductor wafer W vertically placed, the robot hand 40 according to this embodiment moves the mobile body 70 and the rotary body 60 toward the base end more than when the semiconductor wafer W is being gripped, and then, brings all of the standing surfaces 52 of the two engaging members 50, the standing surfaces 57 of the two guiding members 55, and the edge part 62 of the rotary body 60 to face to (or contact) the edge part of the semiconductor wafer W.

Then, for example, when the robot hand 40 scoops up the semiconductor wafer W from the state described above, the semiconductor wafer W is held by three guiding parts including the rotary body 60 (i.e., the lower engaging member 50, the lower guiding member 55, and the rotary body 60). However, in such a state, since the rotary body 60 has the axial clearance, the semiconductor wafer W may backlash and become unstable.

Particularly, when the semiconductor wafer W is scooped up in a state where the rotary body 60 is moved toward the base body 41 in the axial direction, the second contacting part 62a of the rotary body 60 may not contact the edge part of the semiconductor face W, but a principal surface of the rotary body 60 opposite side from the base body 41 may contact a principal surface of the semiconductor wafer W which faces to the base body 41.

Then, if the rotary body 60 is moved toward the tip end on the center line L in such a state, the semiconductor wafer W may come off from the robot hand 40 (i.e., the semiconductor wafer W may be pushed by the rotary body 60 to the front side in the drawing sheet of FIGS. 7(A) and 7(B)).

In terms of this, in this embodiment, the motion regulating part 84 is provided as illustrated in FIGS. 8, 9(A), and 9(B). The motion regulating part 84 regulates the motion of the rotary body 60 in the axial direction by contacting the edge part 62 of the rotary body 60 while the mobile body 70 and the rotary body 60 are moved toward the base end of the base body 41 more than when the semiconductor wafer W is being gripped. Note that the rotary body 60 is prevented from moving in the axial direction by inner walls of the concave parts 88a and 88b formed in the motion regulating part 84 contacting the edge part of the principal surface of the rotary body 60 on the opposite side from the base body 41 in the axial direction.

Accordingly, since the rotary body 60 contacts the motion regulating part 84 when it is moved toward the base end of the base body 41 more than when the semiconductor wafer W is being gripped, a position and a posture of the rotary body 60 are fixed. Therefore, for example, when the rotary body 60 is moved toward the tip end, the semiconductor wafer W does not come off from the robot hand 40. As a result, the robot hand 40 according to this embodiment can certainly grip the semiconductor wafer W.

Note that in the robot hand 40 according to this embodiment the sliding surface 68a of the rotary body 60 slides on the slid surface 77a of the mobile body 70 when the second contacting part 62a of the rotary body 60 receives the reaction force from the semiconductor wafer W. Accordingly, since the second contacting part 62a of the rotary body 60 moves toward the base body 41, the second contacting part 62a can be prevented from moving to separate from the base body 41 due to the reception of the reaction force from the semiconductor wafer W. As a result, the robot hand 40 according to this embodiment can further certainly grip the semiconductor wafer W.

(Modification)

It is apparent for a person skilled in the art from the above description that many improvements and other embodiments of the present disclosure are possible. Therefore, the above description is to be interpreted only as illustration, and it is provided in order to teach a person skilled in the art the best mode for implementing the present disclosure. The details of the structures and/or the functions may be substantially changed, without departing from the spirit of the present disclosure.

Figure 10:
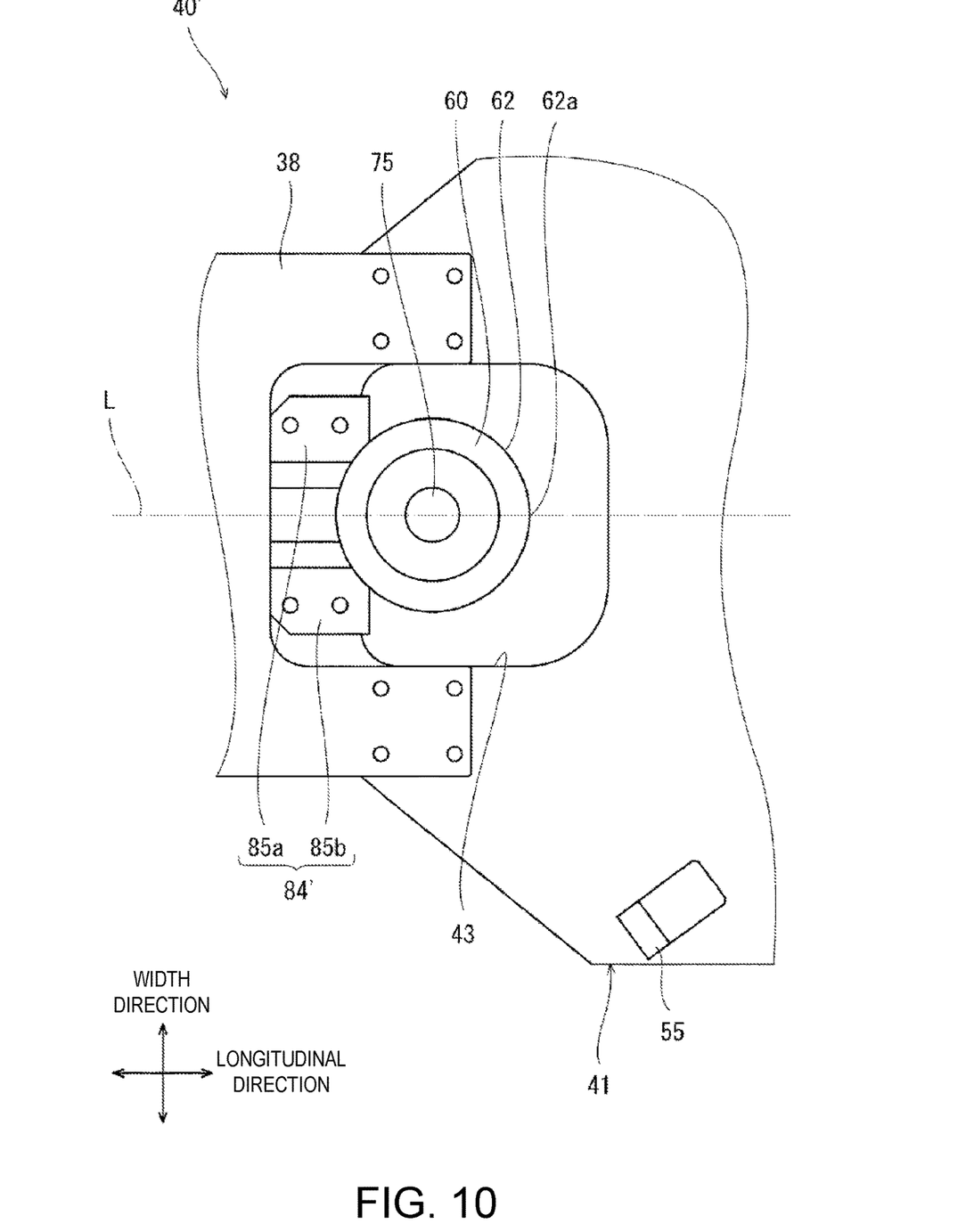
FIG. 10 is a schematic view illustrating a substantial configuration of a modification of the robot hand according to this embodiment of the present disclosure.

FIG. 10 is a schematic view illustrating a substantial configuration of a modification of the robot hand according to the embodiment described above. Note that a robot hand 40' according to this modification has the same structure as the robot hand 40 described in the above embodiment, except for a structure of a motion regulating part 84'. Therefore, the same reference characters are given to the same parts, and similar description is not repeated.

As illustrated in FIG. 10, the motion regulating part 84' of this modification is comprised of a first motion-regulating part 85a and a second motion-regulating part 85b. The first motion-regulating part 85a and the second motion-regulating part 85b are provided having a gap therebetween in the width direction of the base body 41, so as to be line-symmetry with respect to the center line L.

Figure 11:
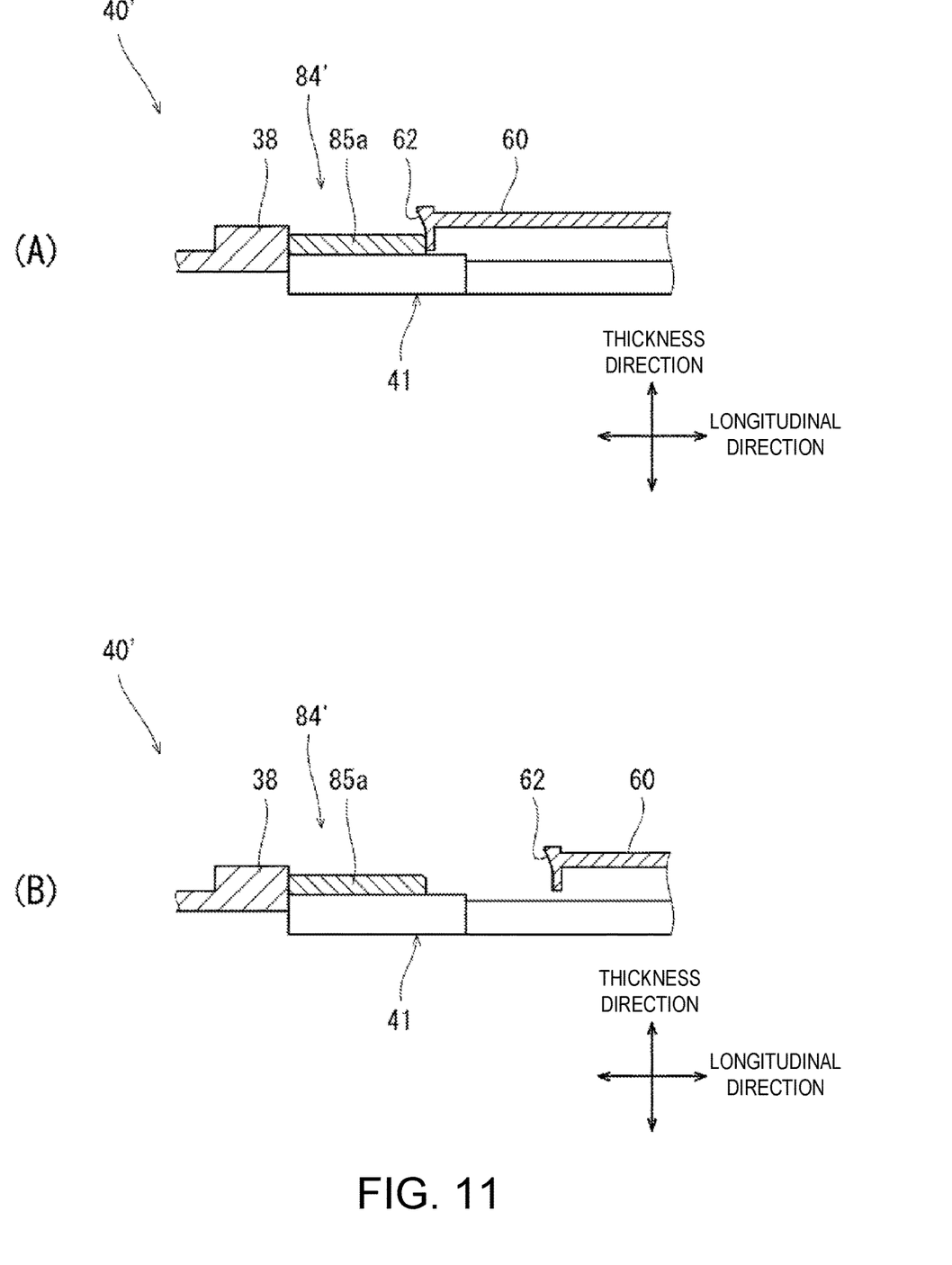
FIG. 11(A) is a cross-sectional view illustrating a state where the motion of the rotary body in the axial direction is regulated.
FIG. 11(B) is a cross-sectional view illustrating a state where the motion of the rotary body in the axial direction is not regulated.

FIGS. 11(A) and 11(B) are schematic views illustrating a situation where a rotary body of this modification moves from the base-end side to the tip-end side, where FIG. 11(A) is a cross-sectional view illustrating a state where the motion of the rotary body in the axial direction is regulated, and FIG. 11(B) is a cross-sectional view illustrating a state where the motion of the rotary body in the axial direction is not regulated. As illustrated in FIGS. 11(A) and 11(B), the motion regulating part 84' according to this modification (in other words, the first motion-regulating part 85a and the second motion-regulating part 85b) can regulate the motion of the rotary body 60 in the axial direction by contacting a circumferential surface (the edge part) of the rotary body 60.

Note that without being limited to the embodiment described above and this modification, the motion regulating part may regulate the motion of the rotary body in the axial direction by contacting at least the edge part of the principal surface of the rotary body on the opposite side from the base body in the axial direction. Moreover, the motion regulating part may regulate the motion of the rotary body in the axial direction by contacting the edge part of the principal surface of the rotary body on the opposite side from the base body in the axial direction, and a part of the edge part of the rotary body other than the circumferential surface.

(Other Modifications)

Although in the embodiment and the modification described above the shaft member 75 is coupled to the mobile member 71, it is not limited to this. For example, the mobile member 71 and the shaft member 75 may be integrally formed so that the entire mobile body 70 is comprised of a single member. In other words, the mobile body may have a mobile part, and a shaft part which is formed integrally with the mobile part.

Although in the embodiment and the modification described above the base body 41 has the base part 42, and the base-branch parts 44 formed integrally with the base part 42, it is not limited to this. For example, the base body may not have the base-branch parts by not being branched at its tip-end side, but may be provided with one or more first contacting parts at the tip-end side of the principal surface of the base body. Alternatively, the base body may be provided with the base part and three or more base-branch parts formed integrally with the base part, and the first contacting part may be provided to the principal surface of each of the three or more base-branch parts.

Although in the embodiment and the modifications described above the substrate is the semiconductor wafer W in the disc-shape, it is not limited to this. For example, the substrate may be a semiconductor wafer in a rectangular plate-shape when seen in its thickness direction, a semiconductor wafer in another shape, or a substrate other than a semiconductor wafer.

Although in the embodiment and the modifications described above the robot 20 is the horizontally articulated 3-axis robot having the turnable wrist part 36, it is not limited to this. For example, the robot may not have the turnable wrist part, or may be configured as a horizontally articulated robot with one, two, or four or more axes. Alternatively, the robot may be configured as a polar coordinate robot, a cylindrical coordinate robot, a Cartesian coordinate robot, a vertically articulated robot, or another robot.

CONCLUSION

In order to solve the problem described above, the robot hand according to one embodiment of the present disclosure includes the base body defining the gripping position of the substrate, the first contacting part provided to the base body at the tip-end side and configured to contact the first part of the edge part of the substrate when the substrate is gripped, the rotary body provided on the base-end side of the base body and having the second contacting part configured to contact the second part of the edge part of the substrate when the substrate is gripped, and the mobile body having the shaft part to be inserted into the shaft hole of the rotary body and configured to move toward the tip end of the base body to move the rotary body toward the tip end of the base body. The axial-center line of the shaft part extends in the thickness direction of the base body, and the rotary body is provided so as to have the axial clearance with respect to the shaft part. The robot hand further includes the motion regulating part configured to regulate the motion of the rotary body in the axial direction by contacting the edge part of the rotary body in the state where the mobile body and the rotary body are moved toward the base end of the base body more than when the substrate is being gripped.

According to this configuration, the motion of the rotary body in the axial direction of the shaft part of the mobile body is regulated by the motion regulating part while the mobile body and the rotary body are moved toward the base end of the base body more than when the substrate is being gripped. Therefore, the robot hand according to the embodiment of the present disclosure can certainly grip the substrate.

The motion regulating part may regulate the motion of the rotary body in the axial direction by contacting at least the edge part of the principal surface of the rotary body, on the opposite side from the base body in the axial direction.

According to this configuration, the robot hand according to the embodiment of the present disclosure can further certainly grip the substrate.

In order to solve the problem described above, the robot according to one embodiment of the present disclosure includes the robot hand having any of the above configurations, and the robotic arm to which the robot hand is attached at the tip end thereof.

According to this configuration, since the robot is provided with the robot hand having any of the above configurations, it can certainly grip the substrate.

DESCRIPTION OF REFERENCE CHARACTERS

10 Robot System
20 Robot
22 Pedestal
24 Lifting Shaft
30 Robotic Arm
32 First Link
34 Second Link
36 Wrist Part
38 Hand-base Part
40, 40' Robot Hand
41 Base Body
42 Base Part
43 Notch
44 Base-branch Part
50 Engaging Member
51 Inclining Surface
52 Standing Surface 52a First Contacting Part
53, 78 Flange
55 Guiding Member
56 Inclining Surface
57 Standing Surface
60 Rotary Body
62 Edge Part
62a Second Contacting Part
68 Shaft Hole
68a Sliding Surface
70 Mobile Body
71 Mobile Member
72 First Part
74 Second Part
74a Concave Part
75 Shaft Member
76 Base-end Part
77 Tapered Part
77a Slid Surface
80 Rail Member
84, 84' Motion Regulating Part
85a First Motion-regulating Part
85b Second Motion-regulating Part
86 Motion-regulating Base Part
87a, 87b Motion-regulating Branch Part
90 Robot Controlling Device
110 Accommodating Device
112 Shell
114 Bottom Plate
116 Bottom-plate Groove
124 Back Plate
126 Back-plate Groove

What is claimed is:

1. A robot hand, comprising:
   a base body defining a gripping position of a substrate;
   a first contacting part provided to the base body at a tip-end side and configured to contact a first part of an edge part of the substrate when the substrate is gripped;
   a rotary body provided on a base-end side of the base body and having a second contacting part configured to contact a second part of the edge part of the substrate when the substrate is gripped; and
   a mobile body having a shaft part to be inserted into a shaft hole of the rotary body, and configured to move toward the tip end of the base body to move the rotary body toward the tip end of the base body,
   wherein an axial-center line of the shaft part extends in a thickness direction of the base body, and the rotary body is provided so as to have a clearance in an axial direction of the shaft part with respect to the shaft part,
   the robot hand further comprising a motion regulating part configured to regulate a motion of the rotary body in the axial direction by contacting an edge part of the rotary body in a state where the mobile body and the rotary body are moved toward the base end of the base body more than when the substrate is being gripped.

2. The robot hand of claim 1, wherein the motion regulating part regulates the motion of the rotary body in the axial direction by contacting at least an edge part of a principal surface of the rotary body, on the opposite side from the base body in the axial direction.

3. A robot, comprising:
   the robot hand of claim 1; and
   a robotic arm to which the robot hand is attached at a tip end of the robotic arm.

* * * * *